(12) United States Patent
Wuu et al.

(10) Patent No.: US 7,740,376 B2
(45) Date of Patent: Jun. 22, 2010

(54) FLEXIBLE LIGHT EMITTING MODULE

(75) Inventors: Dong Sing Wuu, No. 50, Alley 30, Lane 107, Mei-Tsun S. Rd., Nan Dist., Taichung City (TW); Ray-Hua Horng, Taichung (TW); Cheng-Chung Chiang, Taichung (TW); Wen-Chun Chen, Taichung (TW)

(73) Assignee: Dong Sing Wuu, Taichung (TW)

( * ) Notice: Subject to any disclaimer, the term of this patent is extended or adjusted under 35 U.S.C. 154(b) by 241 days.

(21) Appl. No.: 11/772,296

(22) Filed: Jul. 2, 2007

(65) Prior Publication Data

US 2008/0123355 A1    May 29, 2008

(30) Foreign Application Priority Data

Jul. 6, 2006   (TW) .............................. 95124660 A
Feb. 12, 2007  (TW) .............................. 96105080 A

(51) Int. Cl.
*F21V 21/00* (2006.01)
*H01L 29/12* (2006.01)

(52) U.S. Cl. .................... 362/249.04; 362/800; 257/81; 257/E23.007

(58) Field of Classification Search ............ 362/249.02, 362/249.04, 800; 257/81, 99, E23.007, E33.056, 257/E33.058, E33.059
See application file for complete search history.

(56) References Cited

U.S. PATENT DOCUMENTS

| | | | | |
|---|---|---|---|---|
| 5,475,241 A * | 12/1995 | Harrah et al. | .................. | 257/99 |
| 6,874,910 B2 * | 4/2005 | Sugimoto et al. | ........... | 362/294 |
| 6,888,237 B1 * | 5/2005 | Guenther | ..................... | 257/704 |
| 7,488,618 B2 * | 2/2009 | Wood et al. | .................... | 438/72 |
| 2003/0209714 A1 * | 11/2003 | Taskar et al. | .................. | 257/79 |
| 2005/0116235 A1 * | 6/2005 | Schultz et al. | ................ | 257/79 |
| 2008/0009095 A1 * | 1/2008 | Charles et al. | .............. | 438/107 |

* cited by examiner

*Primary Examiner*—Stephen F. Husar
*Assistant Examiner*—Peggy A. Neils
(74) *Attorney, Agent, or Firm*—Stephen A. Bent; Foley & Lardner LLP

(57) ABSTRACT

A flexible light emitting module includes: a flexible substrate; and a flexible multi-layer structure formed on the flexible substrate, and including a plurality of light emitting bare chips that are disposed on the same level and that cooperatively define a spacing thereamong, a dielectric material that fills the spacing and that cooperates with the bare chips to form a light emitting layer, and first and second conductive layers sandwiching and adapted to connect the light emitting layer to a power source.

15 Claims, 6 Drawing Sheets

FLEXIBLE LIGHT EMITTING MODULE

CROSS-REFERENCE TO RELATED APPLICATION

This application claims priority of Taiwanese Patent Application No. 095124660, filed on Jul. 6, 2006 and No. 096105080, filed on Feb. 12, 2007.

BACKGROUND OF THE INVENTION

1. Field of the Invention

This invention relates to a flexible light emitting module, more particularly to a flexible light emitting module including a flexible multi-layer structure, having a plurality of light emitting bare chips, formed on a flexible substrate.

2. Description of the Related Art

U.S. Pat. No. 6,299,337 discloses a conventional flexible multiple LED module that includes a plurality of light-emitting diodes (LEDs), which are in the form of packaged chips, bonded to a flexible circuit board, which is supported on rigid boards, through surface mount techniques. However, since the packaged chips are rigid, the conventional flexible multiple LED module thus formed has a poor flexibility and is not suitable for rolling into a roll for application, transport, or storage purposes due to the rigidity of the packaged chips and the presence of the rigid boards.

SUMMARY OF THE INVENTION

Therefore, the object of the present invention is to provide a flexible light emitting module that can overcome the aforesaid drawbacks associated with the prior art.

According to this invention, there is provided a flexible light emitting module that comprises: a flexible substrate; and a flexible multi-layer structure formed on the flexible substrate, and including a plurality of light emitting bare chips that are disposed on the same level and that cooperatively define a spacing thereamong, and a dielectric material that fills the spacing.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
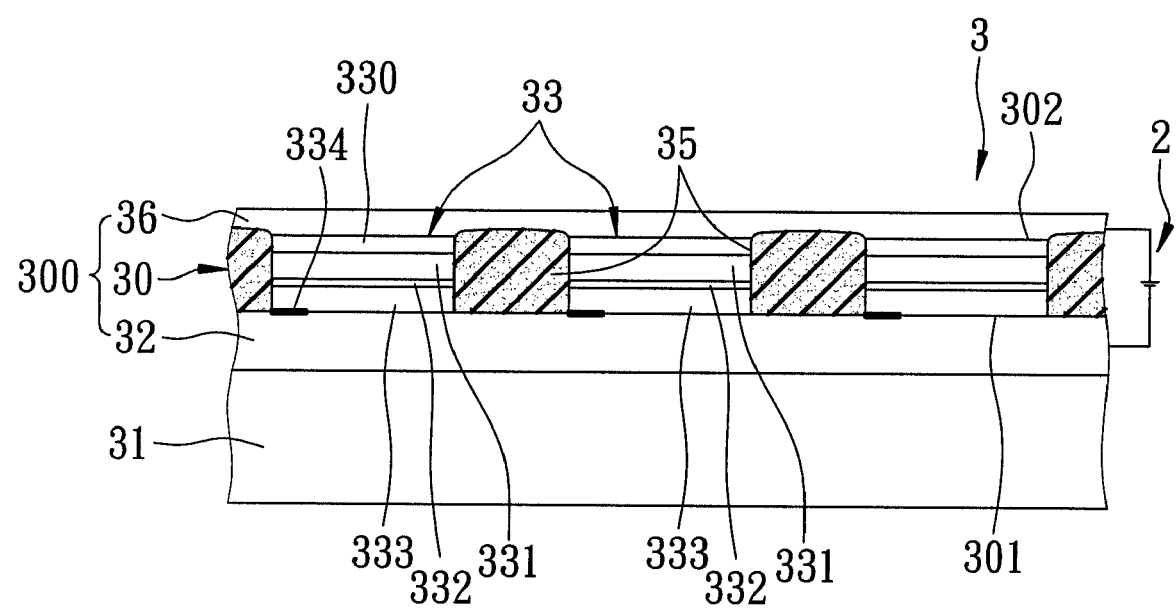
FIG. 1 is a fragmentary schematic partly sectional view of the first preferred embodiment of a flexible light emitting module according to this invention.

Before the present invention is described in greater detail, it should be noted that same reference numerals have been used to denote like elements throughout the specification.

FIG. 1 illustrates the preferred embodiment of a flexible light emitting module according to this invention. The light emitting module 3 includes: a flexible substrate 31; and a flexible multi-layer structure 300 formed on the flexible substrate 31, and including a plurality of spaced apart light emitting bare chips 33 that are disposed on the same level and that cooperatively define a spacing thereamong, and a flexible dielectric material 35 that fills the spacing among the light emitting bare chips 33.

The dielectric material 35 cooperates with the light emitting bare chips 33 to form a flexible light-emitting layer 30 on the flexible substrate 31. In this embodiment, the multi-layer structure 300 further includes a first conductive layer 32 sandwiched between the flexible substrate 31 and one side 301 of the light-emitting layer 30 and bonded and connected electrically to the light emitting bare chips 33. The flexible substrate 31 and the first conductive layer 32 are transparent for passage of light, generated by the light emitting bare chips 33, therethrough.

Preferably, the dielectric material 35 is made from a polymeric material having good flexibility and elasticity, and more preferably, the polymeric material is selected from the group consisting of photoresist material and non-photo sensitive resin material.

Preferably, the flexible substrate 31 is made from an optical grade polymeric material, and more preferably, the optical grade polymeric material is selected from the group consisting of PC and PET.

Preferably, the first conductive layer 32 is made from a material selected from the group consisting of ITO, IZO, Ga-doped ZnO, Al-doped ZnO, and conductive polymers, such as poly(3,4-ethylenedioxythiophene) (PEDOT), polyaniline, and polypyrrole.

In this embodiment, the multi-layer structure 300 further includes a second conductive layer 36 formed on an opposite side 302 of the light-emitting layer 30 that is opposite to said side 301 of the light-emitting layer 30, and bonded and connected electrically to the light emitting bare chips 33. The dielectric material 35 not only serves to isolate the bare chips 33, but also serves to support the second conductive layer 36. The second conductive layer 36 tends to be collapsed or damaged without the support of the dielectric material 35.

Each of the light emitting bare chips 33 includes an epitaxial layer that is in direct contact with the dielectric material 35, and that has first and second semiconductor sub-layers 331, 333 and an active sub-layer 332 sandwiched between the first and second semiconductor sub-layers 331, 333. The second semiconductor sub-layer 333 is formed with an ohmic contact 334 that is bonded electrically to the first conductive layer 32.

Each of the light emitting bare chips 33 further has a metal substrate 330. The first semiconductor sub-layer 331 is formed on the metal substrate 330, and the second conductive layer 36 is formed directly on the metal substrates 330 of the light emitting bare chips 33 and the dielectric material 35. Alternatively, the metal substrate 330 can be replaced with a silicon substrate formed with an electrode layer which is to be bonded to the first semiconductor sub-layer 331 through eutectic bonding techniques.

The second conductive layer 36 is preferably made from a material selected from the group consisting of Al, Ag, Au, Pt, Cu, Ti, and alloys. Note that the first and second conductive layers 32, 36 are for electrical connection to a power source 2, while the metal substrate 330 and the ohmic contact 334 of each of the bare chips 33 serve as electrodes. Formation of the first and second conductive layers 32, 36 are preferably conducted by vapor deposition, followed by plating.

Figure 2:
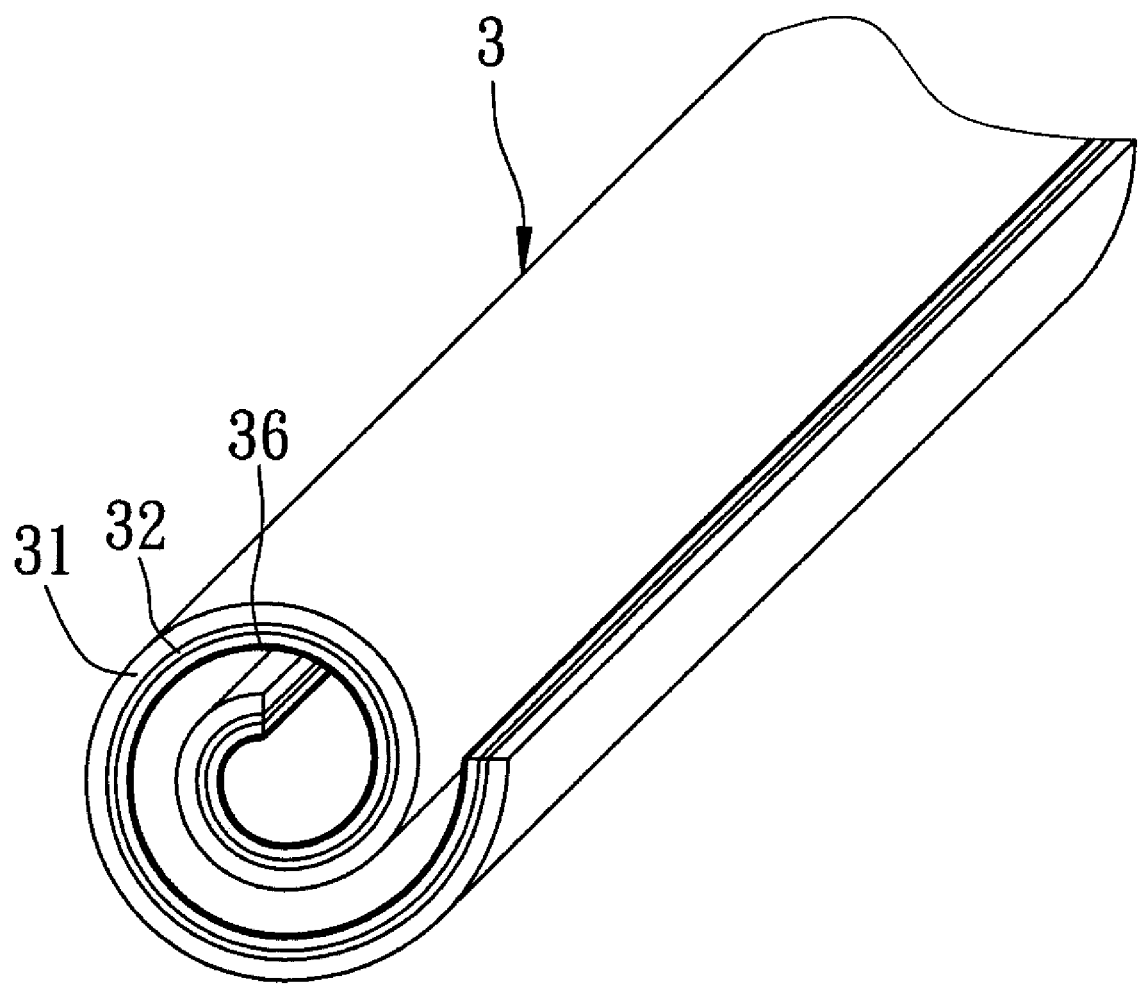
FIG. 2 is a fragmentary perspective view of the first preferred embodiment, illustrating rolling of the same into a roll.

The flexible light emitting module 3 of this invention can be fabricated into a sheet-like or a cable-like light emitting article based on the applications, such as a tubular light source for illumination purposes or an area light source for backlight modules. FIG. 2 shows the configuration of the first preferred embodiment that is fabricated into a sheet-like light emitting article which has sufficient flexibility for rolling into a roll.

Figure 3:
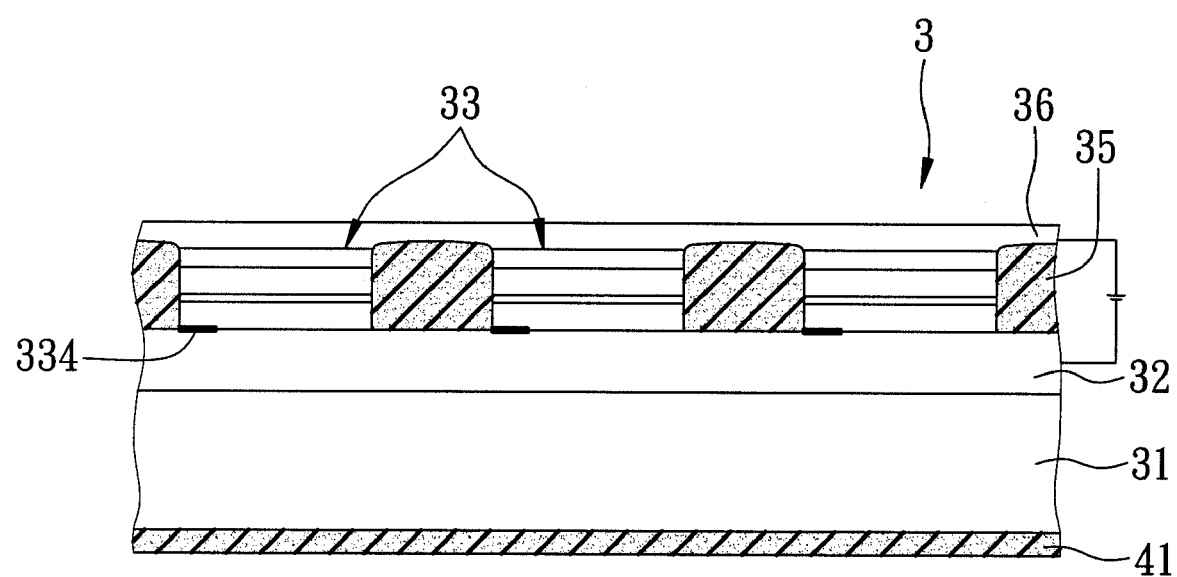
FIG. 3 is a fragmentary schematic partly sectional view of the second preferred embodiment of the flexible light emitting module according to this invention.

FIG. 3 illustrates the second preferred embodiment of the flexible light emitting module 3 according to this invention. The second preferred embodiment differs from the previous embodiment in that a wavelength-converting layer 41 is further included in this embodiment and is formed on the flexible substrate 31 and disposed at one side of the flexible substrate 31 opposite to the first conductive layer 32.

In this embodiment, the wavelength-converting layer 41 is preferably made from a phosphorescent material.

Figure 4:
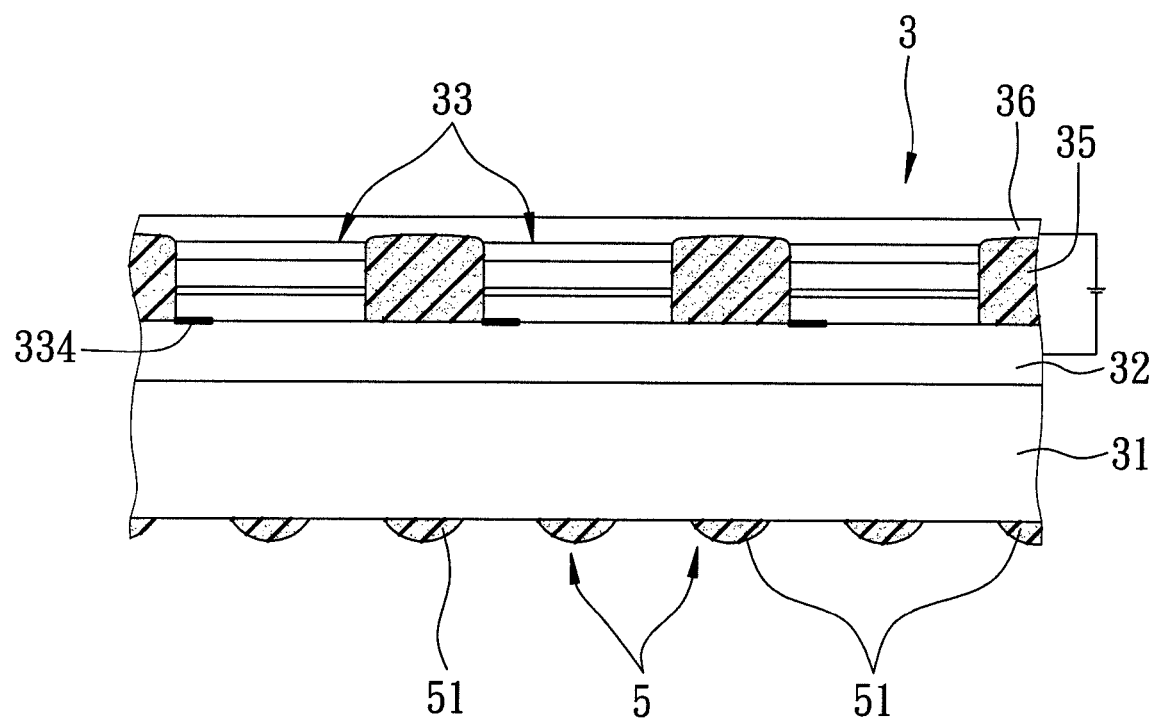
FIG. 4 is a fragmentary schematic partly sectional view of the third preferred embodiment of the flexible light emitting module according to this invention.

FIG. 4 illustrates the third preferred embodiment of the flexible light emitting module 3 according to this invention. The third preferred embodiment differs from the first preferred embodiment in that the flexible substrate 31 is formed with a light-scattering pattern 5 thereon. In this embodiment, the light-scattering pattern 5 is in the form of a plurality of protrusions 51 protruding from one side of the flexible substrate 31 opposite to the first conductive layer 32.

Figure 5:
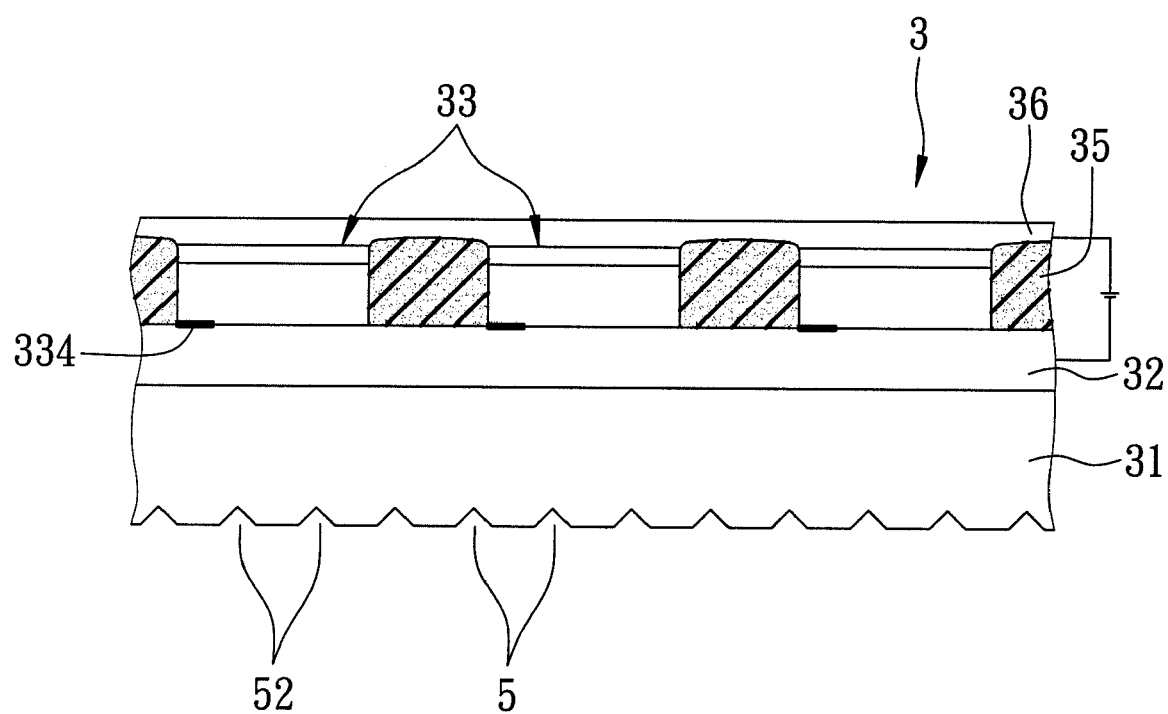
FIG. 5 is a fragmentary schematic partly sectional view of the fourth preferred embodiment of the flexible light emitting module according to this invention.

FIG. 5 illustrates the fourth preferred embodiment of the flexible light emitting module 3 according to this invention. The fourth preferred embodiment differs from the third preferred embodiment in that the light-scattering pattern 5 is in the form of a plurality of recesses 52 indented from said one side of the flexible substrate 31. Each of the recesses 52 is defined by a recess-defining wall that has a tapered cross-section and that can provide a light scattering effect.

The merits of the flexible light emitting module of this invention will become apparent with reference to the following Example.

EXAMPLE

Figure 6:
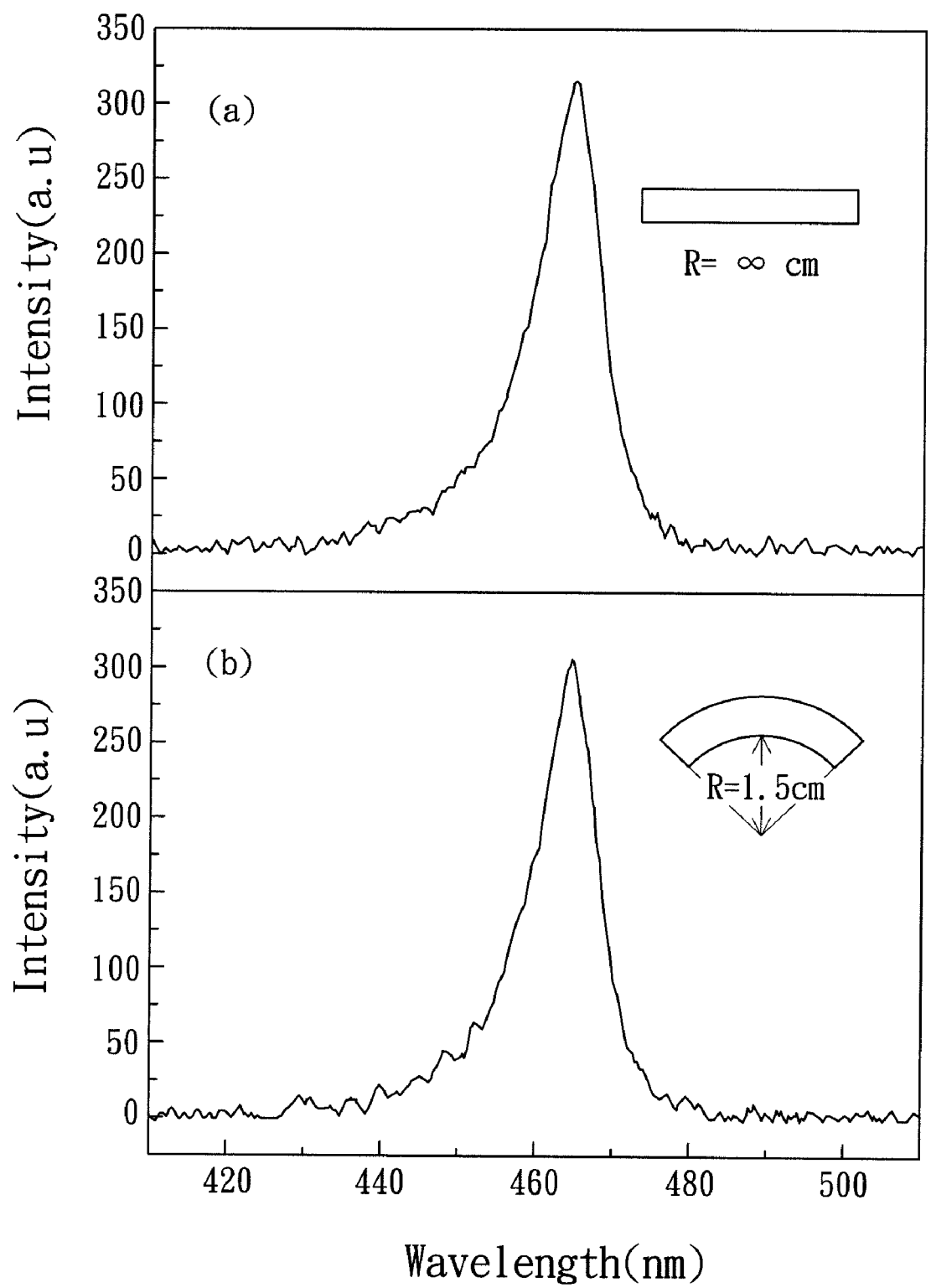
FIG. 6 is a plot illustrating measured illuminating intensities for the preferred embodiment before and after cyclic bending operation

In this example, a 15 μm thick parylene film, a $SiO_2$ layer, and an ITO layer (the 15 μm parylene/100 nm $SiO_2$/150 nm ITO multi-layered serves as a flexible conducting substrate) were deposited on a glass carrier plate. The $SiO_2$ layer was used as the buffer layer to enhance the adhesion between the ITO layer and the parylene film. The LED bare chips were directly bonded to the conducting substrate using solder applied on an Au/Ni electrode of each of the LED bare chips. During the bonding process, the bare chips were picked, orientated, and flipped by a die bonder. Then, a 15 μm-thick negative photoresist (PR) was formed on the LED bare chips array. A UV light was used to pass through the ITO/ $SiO_2$/ parylene/glass from the backside of the glass to crosslink the negative PR, while the LED chips acted as the mask. After the PR was defined by LED chips using the self alignment process, the PR was developed. A thick Al film was formed on the PR layer and the LED bare chips. The plate-type flexible light emitting module thus formed was removed from the glass carrier plate by scraping the parylene film from the glass plate edge using a razor blade, and was subjected to a flexibility test by bending the plate-type light emitting module into a roll having a diameter of 3 cm, and restoring the same to its initial plate shape. The bending-and-restoring operation was repeated 1000 times. The illuminating intensity of the plate-type light emitting module before and after the bending-and-restoring operation was measured. The results (see FIG. 6) show that the illuminating intensity after 1000 times bending-and-restoring operation (indicated as curve (b)) is substantially the same as that before the bending-and-restoring operation (indicated as curve (a)), which is an indication that the flexible light emitting module of this invention has a superior flexibility.

Since the packaged LED chips of the aforesaid conventional flexible light emitting module are relatively rigid, the deposited Al film tend to break by the packaged LED chips during bending of the conventional flexible light emitting module into a roll having a small diameter. As a consequence, the bending extent, i.e., the flexibility, of the conventional flexible light emitting module is relatively poor as compared to the flexible light emitting module of this invention.

By forming the light emitting layer 30, which includes the bare chips 33 and the dielectric material 35, between the first and second conductive layers 32, 36 which have good flexibility and malleability, the multi-layer structure 300 thus formed exhibits excellent flexibility. Hence, combined with the flexible substrate 31, the multi-layer structure 300 is capable of imparting the entire flexible light emitting module 3 with excellent flexibility, which is advantageous in application, transport, and storage.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. A flexible light emitting module comprising:
    a flexible substrate; and
    a flexible multi-layer structure formed on said flexible substrate, and including a plurality of light emitting bare chips that cooperatively define a spacing thereamong, and a dielectric material that fills said spacing;
    wherein said dielectric material cooperates with said light emitting bare chips to form a flexible light-emitting layer on said flexible substrate, and
    wherein said multi-layer structure further includes a first conductive layer sandwiched between said flexible substrate and a first side of said light-emitting layer and bonded and connected electrically to said light emitting bare chips; and
    wherein said multi-layer structure further includes a second conductive layer formed on a second side of said light-emitting layer that is opposite to said first side of said light-emitting layer, and bonded and connected electrically to said light emitting bare chips.

2. The flexible light emitting module of claim 1, wherein said flexible substrate and said first conductive layer are transparent.

3. The flexible light emitting module of claim 2, wherein said flexible substrate is made from an optical grade polymeric material.

4. The flexible light emitting module of claim 3, wherein said optical grade polymeric material is selected from the group consisting of PC and PET.

5. The flexible light emitting module of claim 2, wherein said first conductive layer is made from a material selected from the group consisting of ITO, IZO, Ga-doped ZnO, Al doped ZnO, and conductive polymers.

6. The flexible light emitting module of claim 1, wherein each of said light emitting bare chips includes an epitaxial layer that has first and second semiconductor sub-layers and an active sub-layer sandwiched between said first and second semiconductor sub-layers, said second semiconductor sub-layer being formed with an ohmic contact that is bonded electrically to said first conductive layer.

7. The flexible light emitting module of claim 6, wherein each of said light emitting bare chips further has a metal substrate, said first semiconductor sub-layer being formed on said metal substrate, said second conductive layer being formed directly on said metal substrates of said light emitting bare chips and said dielectric material.

8. The flexible light emitting module of claim 1, wherein said dielectric material is made from a polymeric material.

9. The flexible light emitting module of claim 8, wherein said polymeric material is selected from the group consisting of photoresist material and non-photosensitive resin material.

10. The flexible light emitting module of claim 1, further comprising a wavelength-converting layer formed on said flexible substrate and disposed at one side of said flexible substrate opposite to said first conductive layer.

11. The flexible light emitting module of claim 10, wherein said wavelength-convening layer is made from a phosphorescent material.

12. The flexible light emitting module of claim 1, wherein said flexible substrate is formed with a light-scattering pattern thereon.

13. The flexible light emitting module of claim 12, wherein said light-scattering pattern is in the form of a plurality of protrusions protruding from one side of said flexible substrate opposite to said first conductive layer.

14. The flexible light emitting module of claim 12, wherein said light-scattering pattern is in the form of a plurality of recesses indented from one side of said flexible substrate opposite to said first conductive layer.

15. The flexible light emitting module of claim 1, wherein each of said light emitting bare chips includes an epitaxial layer that is in direct contact with said dielectric material.

* * * * *